(12) United States Patent
Hong et al.

(10) Patent No.: US 9,123,810 B2
(45) Date of Patent: Sep. 1, 2015

(54) SEMICONDUCTOR INTEGRATED DEVICE INCLUDING FINFET DEVICE AND PROTECTING STRUCTURE

(71) Applicant: UNITED MICROELECTRONICS CORP., Hsin-Chu (TW)

(72) Inventors: Shih-Fang Hong, Tainan (TW); Po-Chao Tsao, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 151 days.

(21) Appl. No.: 13/920,093

(22) Filed: Jun. 18, 2013

(65) Prior Publication Data

US 2014/0367780 A1   Dec. 18, 2014

(51) Int. Cl.
*H01L 29/78* (2006.01)

(52) U.S. Cl.
CPC ..................... *H01L 29/785* (2013.01)

(58) Field of Classification Search
CPC .................. H01L 29/66795; H01L 29/41791; H01L 29/42392; H01L 29/785; H01L 27/10879; H01L 27/1211; H01L 27/10826; H01L 27/0886; H01L 27/0924
USPC .......................................................... 257/401
See application file for complete search history.

(56) References Cited

U.S. PATENT DOCUMENTS

| 6,043,138 | A | 3/2000 | Ibok |
| 6,492,216 | B1 | 12/2002 | Yeo |
| 6,921,963 | B2 | 7/2005 | Krivokapic |
| 7,087,477 | B2 | 8/2006 | Fried |
| 7,091,551 | B1 | 8/2006 | Anderson |
| 7,247,887 | B2 | 7/2007 | King |
| 7,250,658 | B2 | 7/2007 | Doris |
| 7,309,626 | B2 | 12/2007 | Ieong |
| 7,329,581 | B2 * | 2/2008 | Kang et al. ..................... 438/275 |
| 7,352,034 | B2 | 4/2008 | Booth, Jr. |
| 7,394,116 | B2 * | 7/2008 | Kim et al. ...................... 257/213 |
| 7,470,570 | B2 | 12/2008 | Beintner |
| 7,531,437 | B2 | 5/2009 | Brask |
| 7,569,857 | B2 | 8/2009 | Simon |
| 2004/0195624 | A1 | 10/2004 | Liu |
| 2005/0051825 | A1 | 3/2005 | Fujiwara |
| 2006/0099830 | A1 | 5/2006 | Walther |
| 2006/0286729 | A1 | 12/2006 | Kavalieros |
| 2007/0108528 | A1 | 5/2007 | Anderson |
| 2007/0158756 | A1 | 7/2007 | Dreeskornfeld |
| 2008/0157208 | A1 | 7/2008 | Fischer |
| 2009/0124097 | A1 | 5/2009 | Cheng |
| 2009/0242964 | A1 | 10/2009 | Akil |
| 2009/0269916 | A1 | 10/2009 | Kang |
| 2010/0048027 | A1 | 2/2010 | Cheng |
| 2010/0072553 | A1 | 3/2010 | Xu |
| 2010/0144121 | A1 | 6/2010 | Chang |
| 2010/0167506 | A1 | 7/2010 | Lin |
| 2013/0277760 | A1 * | 10/2013 | Lu et al. ........................ 257/401 |

* cited by examiner

*Primary Examiner* — Minh-Loan Tran (74) *Attorney, Agent, or Firm* — Winston Hsu; Scott Margo (57) ABSTRACT

A semiconductor integrated device includes a substrate, a plurality of active fins, and a plurality of first protecting fins. The substrate includes an active region, and the active fins are positioned in the active region. The active region is surrounded by the first protecting fins. The active fins and the first protecting fins all extend along a first direction.

19 Claims, 6 Drawing Sheets

SEMICONDUCTOR INTEGRATED DEVICE INCLUDING FINFET DEVICE AND PROTECTING STRUCTURE

BACKGROUND OF THE INVENTION

1. Field of the Invention

The present invention relates to a semiconductor integrated device, and more particularly, to semiconductor integrated device including a Fin Field effect transistor (hereinafter abbreviated as FinFET) device and protecting structures.

2. Description of the Prior Art

Conventional planar metal-oxide-semiconductor (MOS) transistor has difficulty when scaling down to 65 nm and below. Therefore the non-planar transistor technology such as Fin Field effect transistor (FinFET) technology that allows smaller size and higher performance is developed to replace the planar MOS transistor.

The FinFET device is conventionally formed by: First a silicon layer of a substrate is patterned to form fin structures (not shown) by a proper etching process. Then, an insulating layer surrounding lower portions of the fin structures is formed and followed by forming a gate covering a portion of the insulating layer and top portions of the fin structures. Next, dopants are introduced and annealing treatments are performed to form source/drain in the fin structures not covered by the gate. Since the manufacturing processes of the FinFET device are similar to the traditional logic device processes, it provides superior process compatibility. Furthermore, when the FinFET device is formed on the SOI substrate, traditional shallow trench isolation (STI) is no longer in need. More important, since the FinFET device increases the overlapping area between the gate and the fin structures, the channel region is more effectively controlled. This therefore reduces drain-induced barrier lowering (DIBL) effect and short channel effect, and the current between the source and the drain is increased.

However, the FinFET device still faces many problems. For example, because the fin structures are long and slim plate-like structures, they are susceptible to physical or electrical impacts. The long and slim fin structures are even damaged upon those impacts. Therefore, a strong and sufficient protecting structure is always in need for the FinFET device.

SUMMARY OF THE INVENTION

According to an aspect of the present invention, a semiconductor integrated device is provided. The semiconductor integrated device includes a substrate, a plurality of active fins, and a plurality of first protecting fins. The substrate includes at least an active region surrounded by the first protecting fins, and the active fins are positioned in the active region. The active fins and the first protecting fins all extend along a first direction.

According to another aspect of the present invention, a semiconductor integrated device is provided. The semiconductor integrated device includes a substrate, a plurality of active fins, and a plurality of protecting fin frames. The substrate includes at least an active region. The active fins are positioned in the active region, and the protecting fin frames surround the active region.

According to the semiconductor integrated device provided by the present invention, the first protecting fins or the protecting fin frames are formed to surround the active region simultaneously with forming the active fins in the active region. By positioning the first protecting fins or the protecting fin frames, the long and slim active fins in the active region are protected from physical or electrical impacts.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-4 are schematic drawings illustrating a semiconductor integrated device provided by a first preferred embodiment of the present invention, wherein

FIGS. 8-9 are schematic drawings illustrating a semiconductor integrated device provided by a third preferred embodiment of the present invention, wherein

DETAILED DESCRIPTION

Figure 1:
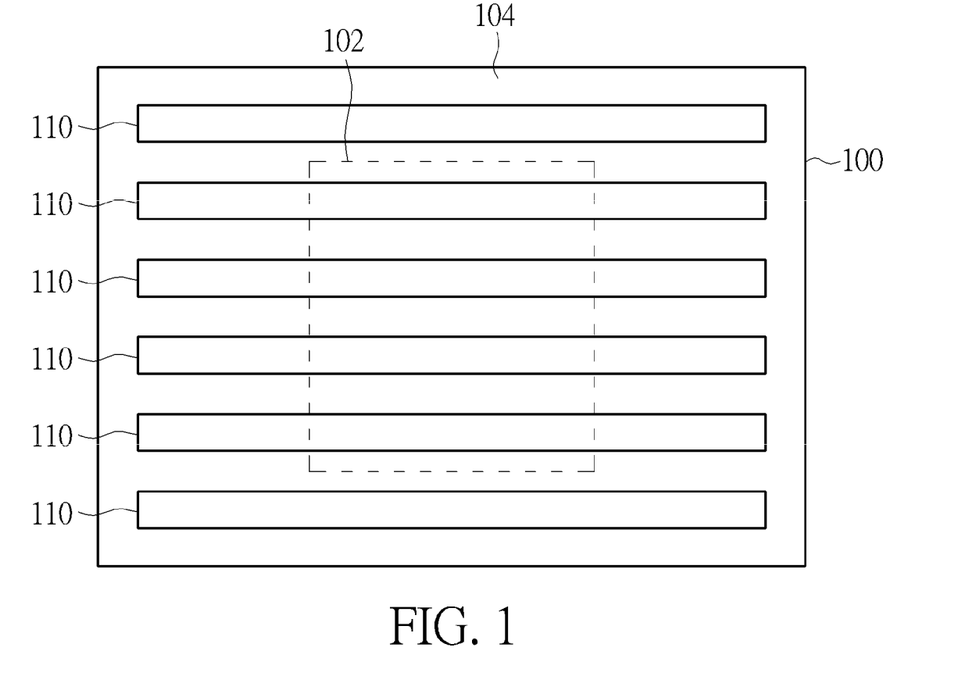

Please refer to FIGS. 1-4, which are schematic drawings illustrating a semiconductor integrated device provided by a first preferred embodiment of the present invention. As shown in FIG. 1, a substrate 100 is provided. The substrate 100 can include a silicon-on-insulator (SOI) substrate or a bulk silicon substrate. It is well-known to those skilled in the art that a SOI substrate upwardly includes a silicon substrate, a bottom oxide (BOX) layer and a semiconductor layer such as a single crystalline silicon layer. The substrate 100 includes an active region 102 and a peripheral region 104 defined thereon. As shown in FIG. 1, the active region 102 is surrounded by the peripheral region 104. However, those skilled in the art would easily realize that spatial relationship and sizes of the active region 102 and the peripheral region 104 are only exemplarily shown in FIG. 1. In other words, the spatial relationship and sizes of the active region 102 and the peripheral region 104 can be adjusted if required. Furthermore, a hard mask layer (not shown) is formed on the substrate 100. In the preferred embodiment, the hard mask layer can be a multi-layered structure such as an oxide/nitride/oxide layer, but not limited to this. Please still refer to FIG. 1. Then, a plurality of mandrel patterns 110 are formed on the hard mask layer. The mandrel patterns 110 can include polysilicon, but not limited to this. It is noteworthy that some of the mandrel patterns 110 are formed across both of the active region 102 and the peripheral region 104 as shown in FIG. 1.

Figure 2:
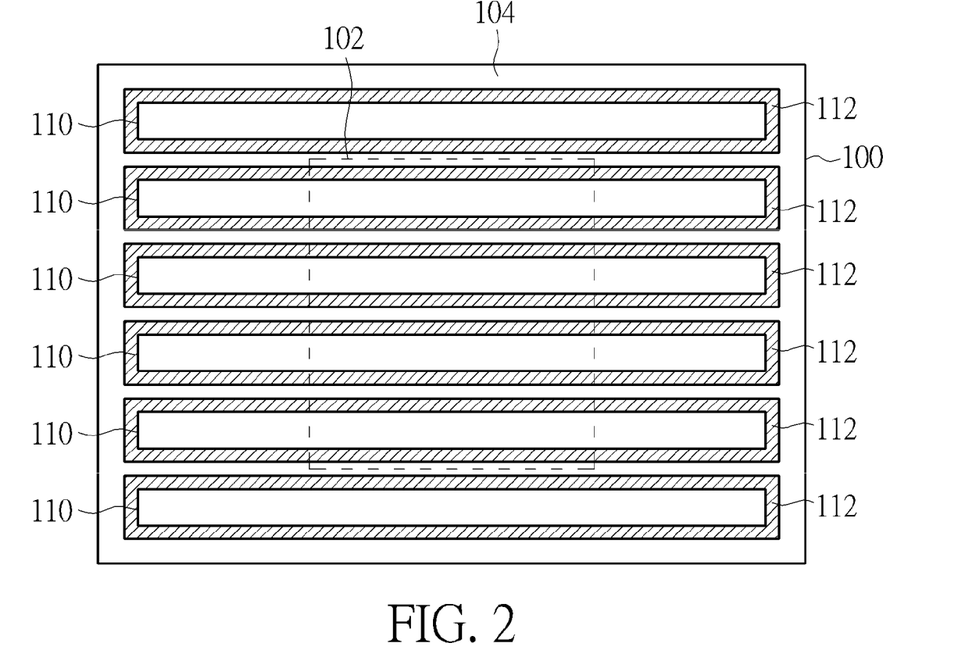
FIG. 2 is a schematic drawing in a step subsequent to FIG. 1.

Please refer to FIG. 2. After forming the mandrel patterns 110 on the substrate 100, a material layer such as an insulating layer, for example but not limited to, a silicon nitride (SiN) layer (not shown) formed by atomic layer deposition (ALD) or chemical vapor deposition (CVD), is blanketly formed on the substrate 100. However, those skilled in the art should understand other suitable material of which an etching rate is different from the mandrel patterns 110 can be involved. Next, the material layer is etched back, and thus a plurality of spacer patterns 112 are formed on sidewalls of the mandrel patterns 110.

Figure 3:
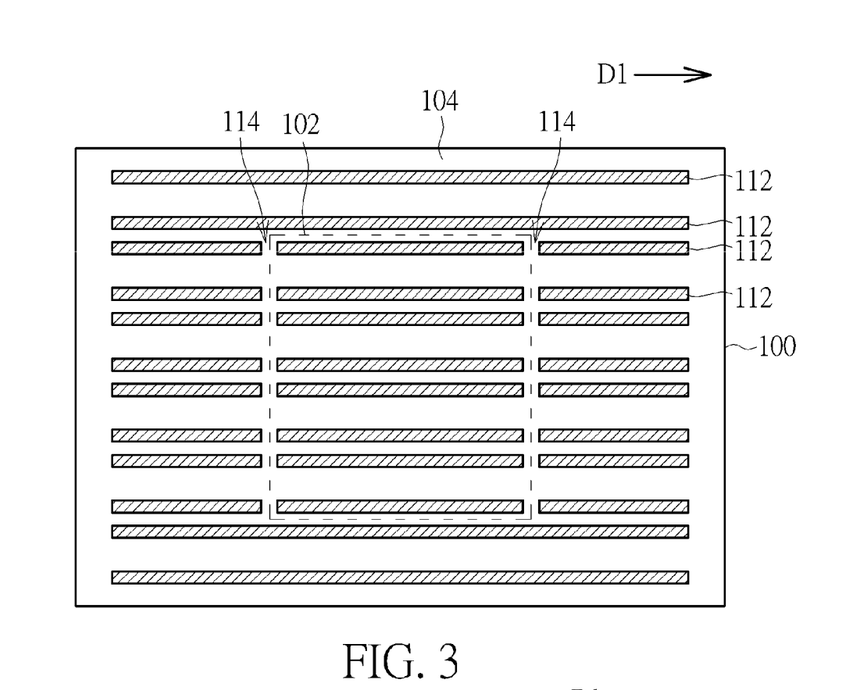
FIG. 3 is a schematic drawing in a step subsequent to FIG. 2.

Please refer to FIG. 3. After forming the spacer patterns 112, an etching process is performed to remove the mandrel patterns 110. It is noteworthy that, portions of the spacer patterns 112, particularly the spacer patterns 112 at two respective ends of the mandrel patterns 110 are removed before, during or after the etching process according to the preferred embodiment. More important, the spacer patterns 112 across the active region 102 and the peripheral region 104 are cut before, during or after the etching process to form gaps 114 in those the spacer patterns 112. As shown in FIG. 3, the gaps 114 are formed in the boundary between the active region 102 and the peripheral region 104 for separating the spacer patterns 112 that used to be across the active region 102 and the peripheral region 104.

Figure 4:
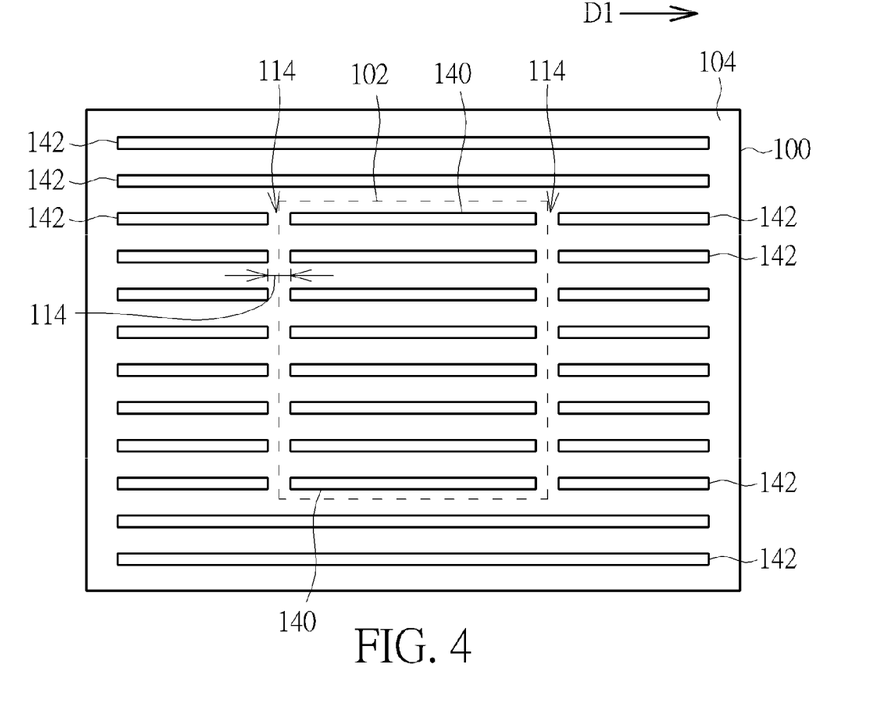
FIG. 4 is a schematic drawing in a step subsequent to FIG. 3.

Please refer to FIG. 4. After forming the spacer patterns 112 and the gaps 114, the hard mask layer is patterned for defining placement and size of fin structures with the spacer patterns 112 serving as masks. Then, the substrate 100 is etched using the patterned hard mask layer as an etching mask. Accordingly, a plurality of fin structures are formed on the substrate 100. After forming the fin structures, the patterned hard mask can be removed if required. It is noteworthy that the fin structures formed in the active region 102 are formed in a region where the source/drain of the FinFET device to be formed, therefore the fin structures in the active region 102 are taken as active fins 140. As shown in FIG. 4, the active fins 140 extend along a first direction D1. It is also noteworthy that, the fin structures formed in the peripheral region 104 serve as a protecting structure for the active fins and/or the FinFET devices in the active region 102, therefore those fin structures are taken as first protecting fins 142. As shown in FIG. 4, the active region 102 is surrounded by the first protecting fins 142. Also, the first protecting fins 142 extend along the first direction D1. More important, the gaps 114 are transferred into the fin structures from the spacer patterns 112. Therefore, the active fins 140 and the first protecting fins 142 in the same row are separated and spaced apart from each other by the gaps 114. In other words, the gaps 114 separate the active fins 140 in the active region 102 from the first protecting fins 142 in the peripheral region 104, therefore characteristics and practical electrical performance of the active fins 140 and/or the devices is prevented from being influenced by the first protecting fins 142. After forming the active fins 140 and the first protecting fins 142, other elements required by FinFET devices are formed in the active region 102. For example, a gate dielectric layer, a gate layer, lightly-doped drains, spacers, and source/drains are sequentially formed and thus at least a FinFET transistor device (not shown) is constructed. Additionally, those skilled in the art would easily realize that process such as metal gate process, selective epitaxial growth (SEG) process, silicide process, inter-layer dielectric formation, contact plug formation, and multi-layer interconnection process can be integrated in the FinFET fabrication if required, and those details are omitted herein in the interest of brevity.

Figure 5:
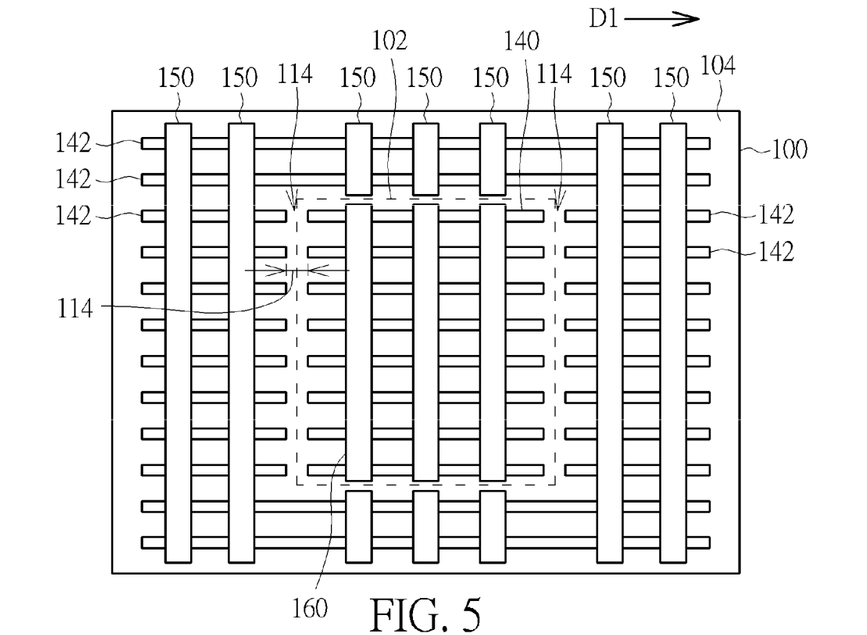
FIG. 5 is a schematic drawing illustrating a modification to the first preferred embodiment.

Please refer to FIG. 5, which is a schematic drawing illustrating a modification to the preferred embodiment. According to the instant modification, a plurality of strengthening structures 150 are formed on the first protecting fins 142 simultaneously with forming the aforementioned elements in the active region 102. As shown in FIG. 5, the strengthening structures 150 can be formed on the first protecting fins 142 simultaneously with forming a gate layer 160 in the active region 102. Accordingly, the strengthening structures 150 can include semiconductor material such as polysilicon. Those skilled in the art would easily realize that the relationship between the gate layers 160 and the active fins 140 are only exemplarily shown in FIG. 5. Each gate layer 160 can be formed across more or less active fins 140 depending on product requirement. Also, Different gate layers 160 can be formed across different active fins 140 if required. Or, the strengthening structures 150 can be formed on the first protecting fins 142 simultaneously with forming metal gates, contact plugs or slot contacts 160 in the active region 102. Accordingly, the strengthening structures 150 can include metal material. In the same concept, the relationship between the metal gates/contact plugs/slot contacts 160 and the active fins 140 can be modified depending on different product requirements. It is noteworthy that the strengthening structures 150 are perpendicular to the first protecting fins 142 in the substrate-horizontal direction and thus the first protecting fins 142 in different rows are electrically connected to each other by the strengthening structures 150. Furthermore, an orthogonal grid pattern is obtained as shown in FIG. 5, and thus structural strength of the first protecting fins 142 in the peripheral region 104 is improved. Additionally, metal layers can be formed on the strengthening structure 150 in the peripheral region 104 simultaneously with forming metal interconnects in the active region 102. Those metals layer, which are electrically isolated from the metal interconnects in the active region 102, are physically and electrically connected to the strengthening structure 150, and thus the structural strength of the first protecting fins 142 in the peripheral region 104 can be further improved.

According to the semiconductor integrated device provided by the preferred embodiment and its modification, the first protecting fins 142 are formed to surround the active region 102 simultaneously with forming the active fins 140 and the strengthening structures 150 are formed to improve the structural strength of the first protecting fins 142. By providing the first protecting fins 142 and the strengthening structure 150, a guard ring for providing electrical isolation or a seal ring for providing physical obstruction is formed, and thus the long and slim active fins 142 in the active region 102 are protected from those physical or electrical impacts. Additionally, since the first protecting fins 142 are formed simultaneously with forming the active fins 140 and the strengthening structures 150 are formed simultaneously with forming elements such as gate layer or contact plugs, the protecting structure for rending the required protection to the active fins 140 is provided without increasing process complexity according to the preferred embodiment.

Figure 6:
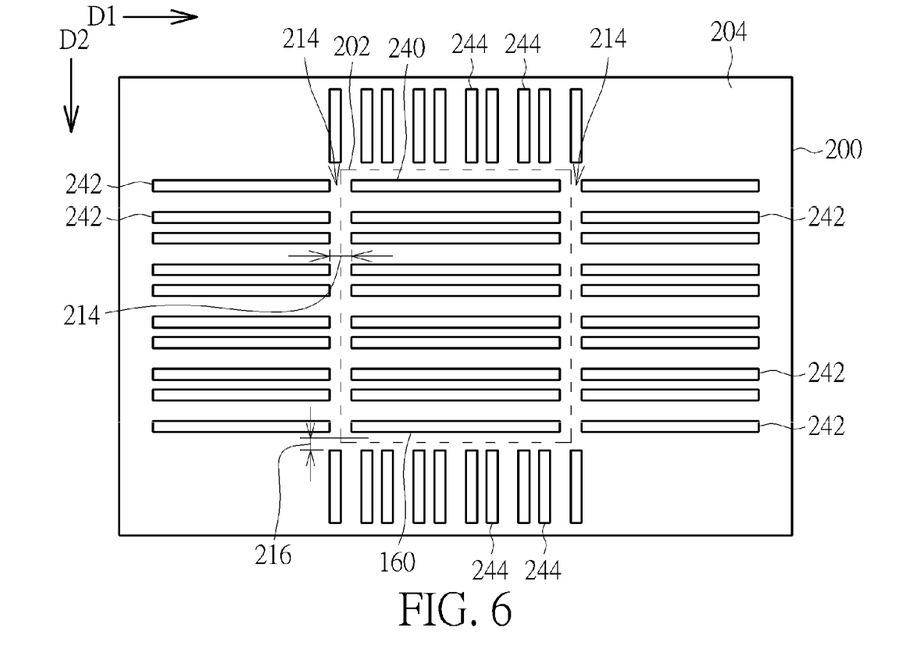
FIG. 6 is a schematic drawing illustrating a semiconductor integrated device provided by a second preferred embodiment of the present invention.

Please refer to FIG. 6, which is a schematic drawing illustrating a semiconductor integrated device provided by a second preferred embodiment of the present invention. It should be noted that since steps for forming the protecting structure are identical in both of the first and second preferred embodiments, those details are omitted in the interest of brevity. As shown in FIG. 6, a substrate 200 is provided. The substrate 200 can include a SOI substrate or a bulk silicon substrate. The substrate 200 includes an active region 202 and a peripheral region 204 defined thereon. As shown in FIG. 6, the active region 202 is surrounded by the peripheral region 204. As mentioned above, those skilled in the art would easily realize that spatial relationship and sizes of the active region 202 and the peripheral region 204 can be adjusted if required. Furthermore, a hard mask layer (not shown) is formed on the substrate 200. Then, a plurality of mandrel patterns (not shown) are formed on the hard mask layer and followed by forming a plurality of spacer patterns (not shown) on sidewalls of the mandrel patterns.

Please refer to FIG. 6 again. After forming the spacer patterns, an etching process is performed to remove the mandrel patterns. It is noteworthy that, portions of the spacer patterns, particularly the spacer patterns at two respective ends of the mandrel patterns are removed before, during or after the etching process according to the preferred embodiment. More important, the spacer patterns across the active region 202 and the peripheral region 204 are cut before, during or after the etching process to form gaps in those the spacer patterns. The gaps are formed in the boundary between the active region 202 and the peripheral region 204 for separating the spacer patterns that used to be across the active region 202 and the peripheral region 204.

Please still refer to FIG. 6. After forming the spacer patterns and the gaps, the hard mask layer is patterned for defining placement and size of fin structures with the spacer patterns serving as masks. Then, the substrate 200 is etched using the patterned hard mask layer as etching mask. Accordingly, a plurality of fin structures are formed on the substrate 200. After forming the fin structures, the patterned hard mask can be removed if required. As mentioned above, the fin structures formed in the active region 102 are taken as active fins 240. As shown in FIG. 6, the active fins 240 extend along a first direction D1. It is also noteworthy that, a plurality of the first protecting fins 242 and a plurality of the second protecting fins 244 are formed in the peripheral region 204 according to the preferred embodiment. The first protecting fins 242 extend along the first direction D1 and are arranged along a second direction D2. The second protecting fins 244 extend along the second direction D2 and are arranged along the first direction D1. The first direction D1 and the second direction D2 are different from each other. In the preferred embodiment, the first direction D1 and the second direction D2 are perpendicular, but not limited to this. Accordingly, the first protecting fins 242 are positioned at two opposite sides of the active region 202 while the second protecting fins 244 are positioned at another two opposite sides of the active region 202 as shown in FIG. 6. In other words, the first protecting fins 242 and the second protecting fins 244 in combination surround the active region 202 for rendering protection. As mentioned above, the gaps are transferred into the fin structures from the spacer patterns. Therefore, the active fins 240 and the first protecting fins 242 in the same row are separated and spaced apart from each other by gaps 214. Additionally, the active fins 240 and the second protecting fins 244 are separated and spaced apart from each other by another gaps 216. In other words, the gaps 214/216 separate the active fins 240 in the active region 102 from the first protecting fins 242/the second protecting fins 244 in the peripheral region 204, therefore characteristics and practical electrical performance of the active fins 240 and/or devices is prevented from being influenced by the first protecting fins 242/the second protecting fins 244. After forming the active fins 240, the first protecting fins 242 and the second protecting fins 244, other elements required by FinFET devices are formed in the active region 202.

Figure 7:
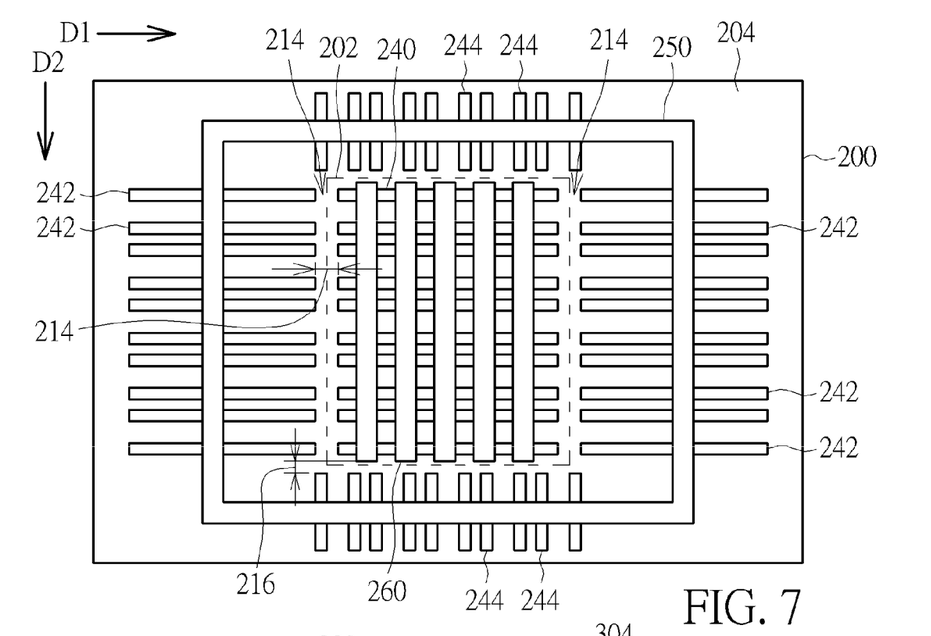
FIG. 7 is a schematic drawing illustrating a modification to the second preferred embodiment.

Please refer to FIG. 7, which is a schematic drawing illustrating a modification to the preferred embodiment. According to the instant modification, at least a strengthening structure 250 is formed on the first protecting fins 242 and the second protecting fins 244 simultaneously with forming the aforementioned elements in the active region 202. As shown in FIG. 7, the strengthening structure 250 can be formed on the first protecting fins 242 and the second protecting fins 244 simultaneously with forming a gate layer 260 in the active region 202. Accordingly, the strengthening structure 250 can include semiconductor material such as polysilicon. Those skilled in the art would easily realize that the relationship between the gate layers 260 and the active fins 240 are only exemplarily shown in FIG. 7. Each gate layer 260 can be formed across more or less active fins 240 depending on product requirement. Also, Different gate layers 260 can be formed across different active fins 240 if required. Or, the strengthening structure 250 can be formed on the first protecting fins 242 and the second protecting fins 244 simultaneously with forming metal gates, contact plugs or slot contacts 260 in the active region 202. Accordingly, the strengthening structure 250 can include metal material. In the same concept, the relationship between the metal gates/contact plugs/slot contacts 260 and the active fins 240 can be modified depending on different product requirements. It is noteworthy that the strengthening structure 250 is perpendicular to both of the first protecting fins 242 and the second protecting fins 244 in the substrate-horizontal direction, and thus the first protecting fins 242 and the second protecting fins 244 are all electrically connected to each other by the strengthening structure 250. Accordingly, structural strength of the first protecting fins 242 and the second protecting fins 244 in the peripheral region 204 is improved. Additionally, metal layers can be formed on the strengthening structure 250 in the peripheral region 204 simultaneously with forming metal interconnects in the active region 202. Those metals layer, which are electrically isolated from the metal interconnects in the active region 202, are physically and electrically connected to the strengthening structure 250, and thus the structural strength of the first protecting fins 242 and the second protecting fins 244 in the peripheral region 204 can be further improved.

According to the semiconductor integrated device provided by the preferred embodiment and its modification, the first protecting fins 242 and the second protecting fins 244 are formed to surround the active region 202 simultaneously with forming the active fins 240 and the strengthening structure 250 is formed to improve the structural strength of the first protecting fins 242 and the second protecting fins 244. By providing the first protecting fins 242, the second protecting fins 244, and the strengthening structure 250, a guard ring for providing electrical isolation or a seal ring for providing physical obstruction is formed, and thus the long and slim active fins 242 in the active region 202 are protected from those physical or electrical impacts. As mentioned above, since the first protecting fins 242 and the second protecting fins 244 are formed simultaneously with forming the active fins 240 and the strengthening structure 250 is formed simultaneously with forming elements such as gate layer or contact plugs, the protecting structure for rending the required protection to the active fins 240 is provided without increasing process complexity according to the preferred embodiment.

Figure 8:
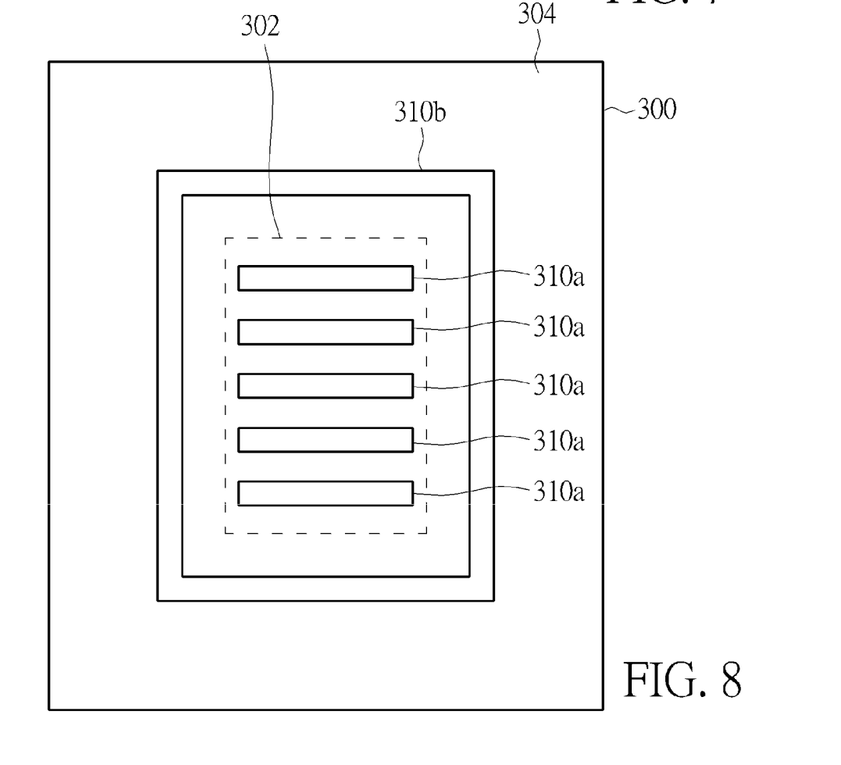
Figure 9:
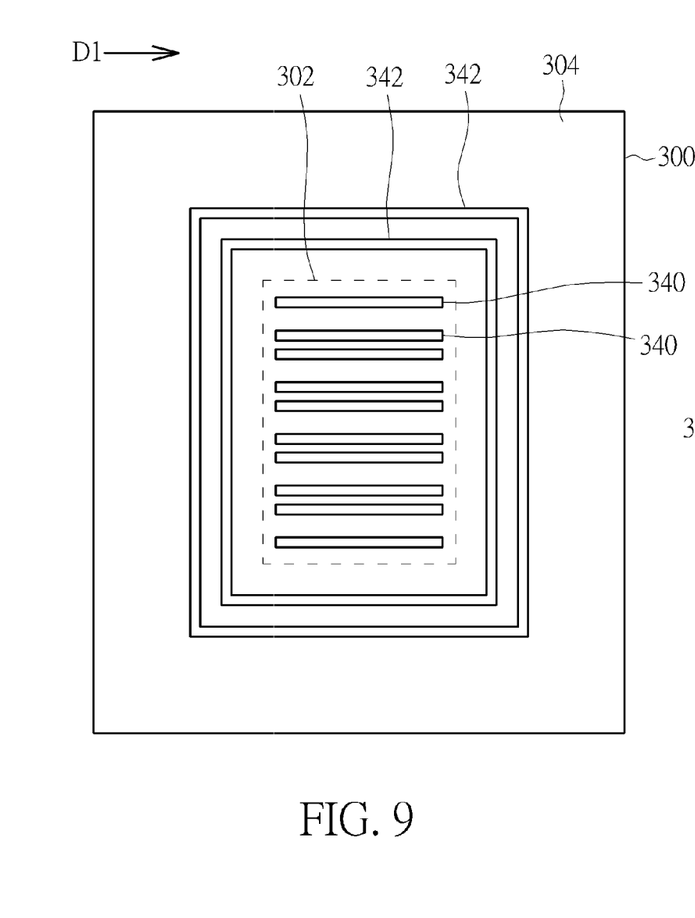
FIG. 9 is a schematic drawing in a step subsequent to FIG. 8.

Please refer to FIGS. 8-9, which are schematic drawings illustrating a semiconductor integrated device provided by a third preferred embodiment of the present invention. As shown in FIG. 8, a substrate 300 is provided. The substrate 300 includes an active region 302 and a peripheral region 304 defined thereon. As shown in FIG. 8, the active region 302 is surrounded by the peripheral region 304. As mentioned above, those skilled in the art would easily realize that spatial relationship and sizes of the active region 302 and the peripheral region 304 can be adjusted if required. Furthermore, a hard mask layer (not shown) is formed on the substrate 300. Then, a plurality of mandrel patterns 310a/310b are formed on hard mask layer. The mandrel patterns 310a/310b can include polysilicon, but not limited to this. It is noteworthy that the mandrel patterns 310a in the active region 302 are different from the mandrel patterns 310b in the peripheral region 304 according to the preferred embodiment: The mandrel patterns 310a in the active region 302 are formed according to product requirements, however the mandrel patterns 310b in the peripheral region 304 are formed to have a frame shape for surrounding and sealing the active region 302.

Please refer to FIG. 9. After forming the mandrel patterns 310a/310b on the substrate 300, a material layer having an etching rate different from the mandrel patterns 310a/310b under the same etching recipe is blanketly formed on the substrate 300. Next, the material layer is etched back, and thus a plurality of spacer patterns (not shown) is formed on sidewalls of the mandrel patterns 310a/310b. After forming the spacer patterns, an etching process is performed to remove the mandrel patterns 310a/310b. It is noteworthy that, portions of the spacer patterns, particularly the spacer patterns at two respective ends of the mandrel patterns 310a in the active region 302 are removed before, during or after the etching process according to the preferred embodiment. Next, the hard mask layer is patterned for defining placement and size of fin structures with the spacer patterns serving as masks. Then, the substrate 300 is etched using the patterned hard mask layer as etching mask. Accordingly, a plurality of fin structures is formed on the substrate 300. After forming the fin structures, the patterned hard mask can be removed if required. It is noteworthy that the fin structures formed in the active region 302 are taken as active fins 340. As shown in FIG. 9, the active fins 340 extend along a first direction D1. It is also noteworthy that, the fin structures formed in the peripheral region 304 serve as a protecting structure for the active fins 340 and/or the FinFET devices in the active region 302, and the fin structures obtain the frame shape inherently from the mandrel pattern 310b, therefore those fin structures are taken as protecting fin frames 342. And the protecting fin frames 342 are all concentric. As shown in FIG. 9, the active region 302 is surrounded and sealed by the protecting fin frames 342. Additionally, the protecting fin frames 342 are physically and electrically isolated from the active fins 340, therefore characteristics and practical electrical performance of the active fins 340 and/or devices is prevented from being influenced by the protecting fin frames 342. After forming the active fins 340 and the protecting fin frames 342, other elements required by FinFET devices are formed in the active region 302.

Figure 10:
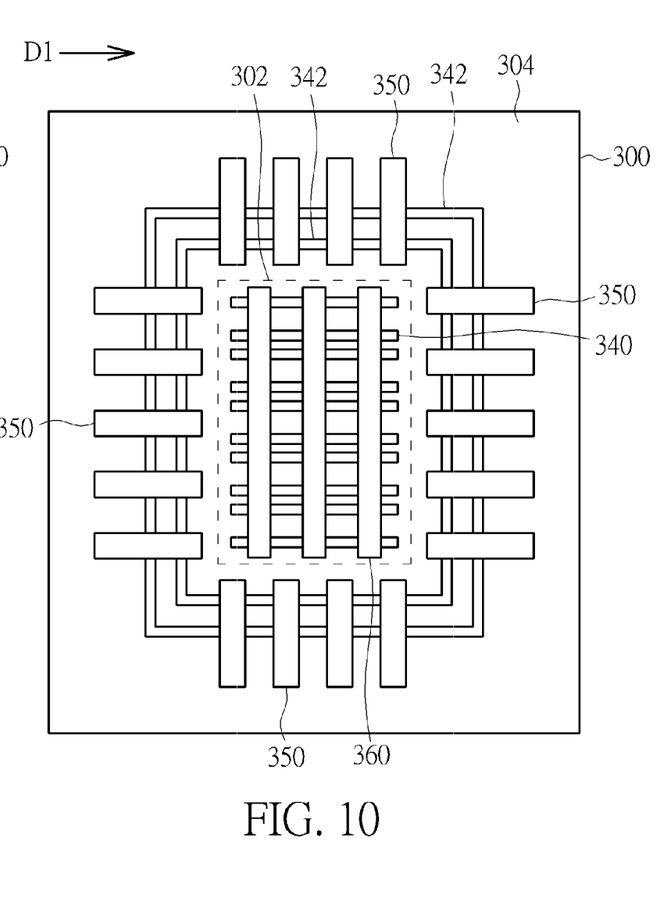
FIG. 10 is a schematic drawing illustrating a modification to the third preferred embodiment.

Please refer to FIG. 10, which is a schematic drawing illustrating a modification to the preferred embodiment. According to the instant modification, a plurality of strengthening structures 350 is formed on the protecting fin frames 342 simultaneously with forming the aforementioned elements in the active region 302. As shown in FIG. 10, the strengthening structures 350 can be formed on the protecting fin frames 342 simultaneously with forming a gate layer 360 in the active region 302. Accordingly, the strengthening structures 350 can include semiconductor material such as polysilicon. Those skilled in the art would easily realize that the relationship between the gate layer 360 and the active fins 340 are only exemplarily shown in FIG. 10. Each gate layer 360 can be formed across more or less active fins depending on product requirement. Also, Different gate layer 360 can be formed across different active fins 340 if required. Or, the strengthening structures 350 can be formed on the protecting fin frames 342 simultaneously with forming metal gates, contact plugs or slot contacts 360 in the active region 302. Accordingly, the strengthening structures 350 can include metal material. In the same concept, the relationship between the metal gates/contact plugs/slot contacts 360 and the active fins 36 can be modified depending on different product requirement. It is noteworthy that the strengthening structures 350 are perpendicular to any part of the protecting fin frames 342 in the substrate-horizontal direction, and thus the concentric protecting fin frames 342 are all electrically connected to each other by the strengthening structures 350. Accordingly, structural strength of the protecting fin frames 342 in the peripheral region 304 is improved. Additionally, metal layers can be formed on the strengthening structures 350 in the peripheral region 304 simultaneously with forming metal interconnects in the active region 302. Those metals layer, which are electrically isolated from the metal interconnects in the active region 302, are physically and electrically connected to the strengthening structures 350, and thus the structural strength of the protecting fin frames 342 in the peripheral region 304 can be further improved.

According to the semiconductor integrated device provided by the preferred embodiment and its modification, the protecting fin frames 342 are formed to surround and seal the active region 302 simultaneously with forming the active fins 340 and the strengthening structures 350 are formed to improve the structural strength of the protecting fin frames 342. By providing the protecting fin frames 342 and the strengthening structures 350, a guard ring for providing electrical isolation or a seal ring for providing physical obstruction is formed, and thus the long and slim active fins 342 in the active region 302 are protected from those physical or electrical impacts. Additionally, since the protecting fin frames 342 are formed simultaneously with forming the active fins 340 and the strengthening structures 350 are formed simultaneously with forming elements such as gate layer or contact plugs, the protecting structure for rending the required protection to the active fins 340 is provided without increasing process complexity according to the preferred embodiment.

Figure 11:
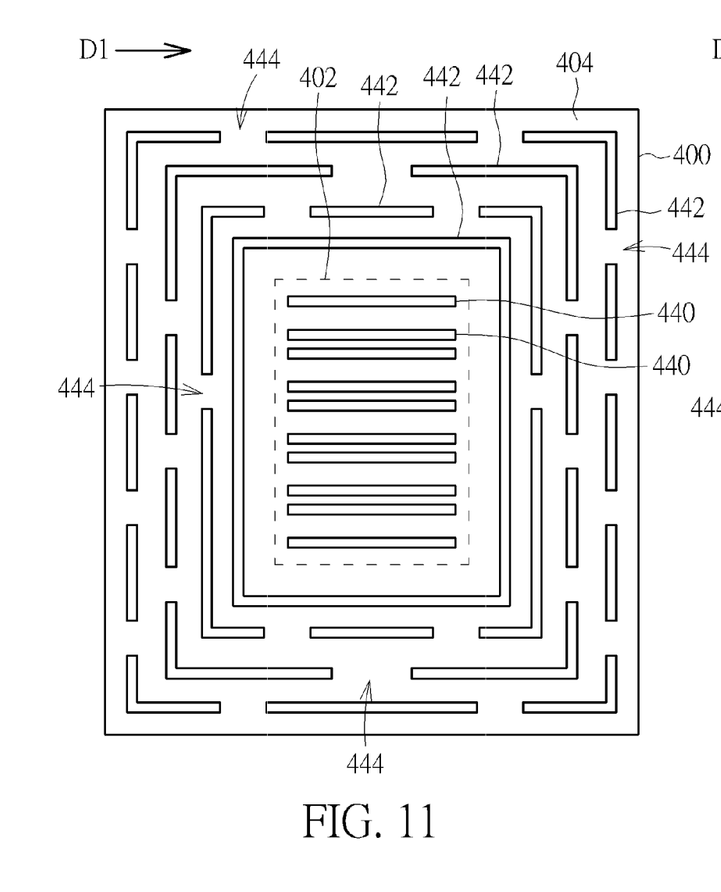
FIG. 11 is a schematic drawing illustrating a semiconductor integrated device provided by a fourth preferred embodiment of the present invention.

Please refer to FIG. 11, which is a schematic drawing illustrating a semiconductor integrated device provided by a fourth preferred embodiment of the present invention. It should be noted that since steps for forming the protecting structure are identical in both of the third and fourth preferred embodiments, those details are omitted in the interest of brevity. As shown in FIG. 11, a substrate 400 is provided. The substrate 400 can include a SOI substrate or a bulk silicon substrate. The substrate 400 includes an active region 402 and a peripheral region 404 defined thereon. As shown in FIG. 11, the active region 402 is surrounded by the peripheral region 404. As mentioned above, those skilled in the art would easily realize that spatial relationship and sizes of the active region 402 and the peripheral region 404 can be adjusted if required. Furthermore, a hard mask layer (not shown) is formed on the substrate 400. Then, a plurality of mandrel patterns (not shown) is formed on the hard mask layer. It is noteworthy that the mandrel patterns in the active region 402 are different from the mandrel patterns in the peripheral region 404 according to the preferred embodiment: The mandrel patterns in the active region 402 are formed according to product requirements, however the mandrel patterns in the peripheral region 404 are formed to have a frame shape for surrounding and sealing the active region 402.

Please still refer to FIG. 11. After forming the mandrel patterns on the substrate 400, a plurality of spacer patterns (not shown) is formed on sidewalls of the mandrel patterns and followed by performing an etching process to remove the mandrel patterns. It is noteworthy that, portions of the spacer patterns, particularly the spacer patterns at two respective ends of the mandrel patterns in the active region 402, and particularly at least a spacer pattern in the peripheral region 404 are removed before, during or after the etching process according to the preferred embodiment. Next, the hard mask layer is patterned for defining placement and size of fin structures with the spacer patterns serving as masks. Then, the substrate 400 is etched using the patterned hard mask layer as etching mask. Accordingly, a plurality of fin structures is formed on the substrate 400. After forming the fin structures, the patterned hard mask can be removed if required.

It is noteworthy that the fin structures formed in the active region 402 are taken as active fins 440. As shown in FIG. 11, the active fins 440 extend along a first direction D1. It is also noteworthy that, the fin structures formed in the peripheral region 404 serve as a protecting structure for the active fins and/or the FinFET devices in the active region 402, and the fin structures obtain the frame shape inherently from the mandrel pattern, therefore those fin structures are taken as protecting fin frames 442. And the protecting fin frames 442 are all concentric. As shown in FIG. 11, the active region 402 is surrounded and sealed by the protecting fin frames 442. Additionally, the protecting fin frames 442 are physically and electrically isolated from the active fins 440, therefore characteristics and practical electrical performance of the active fins 440 and/or devices is prevented from being influenced by the protecting fin frames 442. More important, each of the protecting fin frames 442 further includes a plurality of gaps 444 formed therein except the innermost protecting fin frame 442*a* according to the preferred embodiment. As shown in FIG. 11, the gaps 444 are formed to interrupt each protecting fin frame 442 and corresponding to sidewalls of two adjacent protecting fin frames 442. Consequently, a labyrinth pattern is obtained as shown in FIG. 11. After forming the active fins 440 and the protecting fin frames 442, other elements required by FinFET devices are formed in the active region 402.

Figure 12:
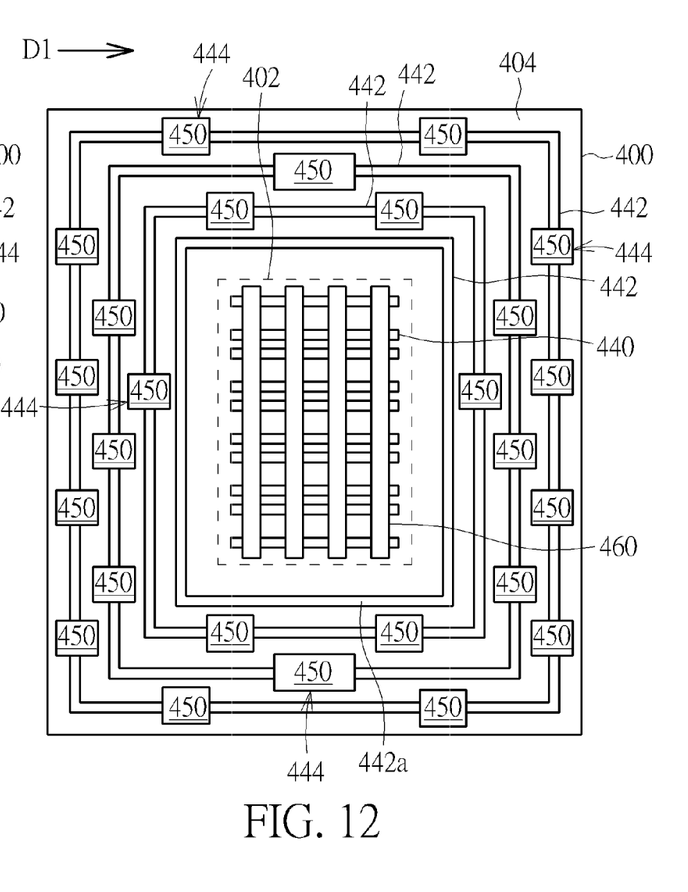
FIG. 12 is a schematic drawing illustrating a modification to the fourth preferred embodiment.

Please refer to FIG. 12, which is a schematic drawing illustrating a modification to the preferred embodiment. According to the instant modification, a plurality of strengthening structures 450 is formed in the protecting fin frames 442 simultaneously with forming the aforementioned elements in the active region 402. As shown in FIG. 12, the strengthening structures 450 can be formed on the protecting fin frames 442 simultaneously with forming a gate layer 460 in the active region 402. Accordingly, the strengthening structures 450 can include semiconductor material such as polysilicon. Those skilled in the art would easily realize that the relationship between the gate layer 460 and the active fins 440 are only exemplarily shown in FIG. 12. Each gate layer 460 can be formed across more or less active fins depending on product requirement. Also, Different gate layer 460 can be formed across different active fins 440 if required. Or, the strengthening structures 450 can be formed on the protecting fin frames 442 simultaneously with forming metal gates, contact plugs or slot contacts 460 in the active region 402. Accordingly, the strengthening structures 450 can include metal material. In the same concept, the relationship between the metal gates/contact plugs/slot contacts 460 and the active fins 440 can be modified depending on different product requirement. It is noteworthy that the strengthening structures 450 are formed to fill up the gaps 444 in each protecting fin frame 442. Furthermore, the concentric protecting fin frames 442 can be all electrically connected to each other by filling the gaps 444 with the strengthening structures 450 much larger than the gaps 444. Accordingly, structural strength of the protecting fin frames 442 in the peripheral region 404 is improved. Additionally, metal layers can be formed on the strengthening structures 450 in the peripheral region 404 simultaneously with forming metal interconnects in the active region 402. Those metals layer, which are electrically isolated from the metal interconnects in the active region 402, are connected to the strengthening structures 450, and thus the structural strength of the protecting fin frames 442 in the peripheral region 404 can be further improved.

According to the semiconductor integrated device provided by the preferred embodiment and its modification, the protecting fin frames 442 are formed to surround and seal the active region 402 simultaneously with forming the active fins 440 and the strengthening structures 450 are formed to improve the structural strength of the protecting fin frames 442. By providing the protecting fin frames 442 and the strengthening structures 450, a guard ring for providing electrical isolation or a seal ring for providing physical obstruction is formed, and thus the long and slim active fins 442 in the active region 402 are protected from those physical or electrical impacts. Additionally, since the protecting fin frames 442 are formed simultaneously with forming the active fins 440 and the strengthening structures 350 are formed simultaneously with forming elements such as gate layer or contact plugs, the protecting structure for rending the required protection to the active fins 440 is provided without increasing process complexity according to the preferred embodiment.

Accordingly, the semiconductor integrated device provided by the present invention includes the first protecting fins or the protecting fin frames formed to surround the active region simultaneously with forming the active fins in the active region. By positioning the first protecting fins or the protecting fin frames, guard ring for providing electrical isolation or a seal ring for providing physical obstruction is formed. In other words, by providing the first protecting fins or the protecting fin frames, the long and slim the active fins in the active region are protected from those physical or electrical impacts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor integrated device, comprising:
   a substrate having an active region defined thereon;
   a plurality of active fins positioned in the active region, the active fins extending along a first direction;
   a plurality of first protecting fins surrounding the active region, the first protecting fins extending along the first direction; and
   a plurality of strengthening structures positioned on the first protecting fins.

2. The semiconductor integrated device according to claim 1, wherein the active fins and the first protecting fins arranged in the same row are spaced apart from each other by a gap.

3. The semiconductor integrated device according to claim 1, wherein the strengthening structures are perpendicular to the first protecting fins, and the first protecting fins are connected to each other by the strengthening structure.

4. The semiconductor integrated device according to claim 1, wherein the strengthening structures comprise semiconductor material or metal material.

5. The semiconductor integrated device according to claim 1, further comprising a plurality of second protecting fins positioned on the substrate, the second protecting fins being extended along a second direction, and the second direction is different from the first direction.

6. The semiconductor integrated device according to claim 5, wherein the first protecting fins are arranged at two opposite sides of the active region, and the second protecting fins are arranged at another two opposite sides of the active region.

7. The semiconductor integrated device according to claim 5, wherein the strengthening structures are positioned on the first protecting fins and the second protecting fins.

8. The semiconductor integrated device according to claim 7, wherein the strengthening structure is perpendicular to the first protecting fins and the second protecting fins.

9. The semiconductor integrated device according to claim 7, wherein the strengthening structure comprises semiconductor material or metal material.

10. A semiconductor integrated device, comprising:
a substrate having an active region defined thereon;
a plurality of active fins positioned in the active region; and
a plurality of protecting fin frames surrounding the active region, at least one of the protecting fin frames comprising a first portion parallel with the active fins and a second portion perpendicular to the active fins, and the first portion physically contacting the second portion.

11. The semiconductor integrated device according to claim 10, wherein the protecting fin frames are concentric.

12. The semiconductor integrated device according to claim 10, further comprising a plurality of strengthening structures positioned on the protecting fin frames.

13. The semiconductor integrated device according to claim 12, wherein the protecting fin frames are connected to each other by the strengthening structures.

14. The semiconductor integrated device according to claim 12, wherein the strengthening structures are perpendicular to the protecting fin frames.

15. The semiconductor integrated device according to claim 12, wherein the strengthening structures comprise semiconductor material or metal material.

16. The semiconductor integrated device according to claim 10, further comprising a plurality of gaps formed in each protecting fin frame, and the gaps interrupting each protecting fin frame.

17. The semiconductor integrated device according to claim 16, wherein the gaps are corresponding to sidewalls of adjacent protecting fin frames.

18. The semiconductor integrated device according to claim 16, further comprising a plurality of strengthening structures, and the gaps are filled with the strengthening structures.

19. The semiconductor integrated device according to claim 18, wherein the strengthening structures comprise semiconductor material or metal material.

* * * * *